United States Patent [19]

Fowler

[11] 3,824,587

[45] July 16, 1974

[54] DUAL MODE ANGLE ENCODER

[75] Inventor: John T. Fowler, Winthrop, Mass.

[73] Assignee: The Laitram Corporation, New Orleans, La.

[22] Filed: Oct. 25, 1972

[21] Appl. No.: 300,771

[52] U.S. Cl. ........................ 340/347 P, 340/347 DD
[51] Int. Cl. ........................ G08c 9/08
[58] Field of Search.... 340/347 P, 347 DD, 347 DA

[56] References Cited

UNITED STATES PATENTS

| | | | |
|---|---|---|---|
| 2,685,054 | 7/1954 | Brenner et al. | 340/347 P X |
| 2,685,084 | 7/1954 | Lippel et al. | 340/347 DA |
| 2,711,499 | 6/1955 | Lippel | 340/347 DD X |
| 2,714,204 | 7/1955 | Lippel et al. | 340/347 P |
| 2,986,726 | 5/1961 | Jones | 340/347 P |
| 3,064,889 | 11/1962 | Hupp | 340/347 DD X |
| 3,188,626 | 6/1965 | Palmer | 340/347 P |
| 3,560,959 | 2/1971 | Bergey | 340/347 DD |

*Primary Examiner*—Charles D. Miller
*Attorney, Agent, or Firm*—Weingarten, Maxham & Schurgin

[57] ABSTRACT

An angle encoder for selectively providing from a single rotatable code element an output indication of the angular position of the rotatable element and of angular deviation and sense with respect to a reference position. A Gray coded code element is employed and from which a Gray code is sensed to provide digital signals which are processed by associated logic circuitry operative in two modes. In one mode an output indication is provided of the angular position of the code element, while in a second mode an output indication is provided of the extent and sense of angular deviation of the code element.

4 Claims, 6 Drawing Figures

| I | C | A | B |
|---|---|---|---|
| 0 | 0 | 1 | 1 |
| 1 | 0 | 1 | 0 |
| 0 | 1 | 1 | 1 |
| 1 | 1 | 0 | 1 |

180° MODE

360° MODE

| Q1 | B | Q2 |
|---|---|---|
| 0 | 0 | 0 |
| 1 | 0 | 1 |
| 0 | 1 | 1 |
| 1 | 1 | 1 |

DUAL MODE ANGLE ENCODER

FIELD OF THE INVENTION

This invention relates to angle encoders and more particularly to an absolute encoder capable of selectively providing output indications of angular position and angular deviation with respect to a reference position.

BACKGROUND OF THE INVENTION

Angle encoders are well known for providing an indication of the angular position of a shaft or other rotatable member. In one class of encoders known as absolute encoders, a rotatable code element such as a disk has a plurality of sensible codes arranged therearound, these codes being read by an associated sensor to provide an output indication of the angular position of the code element about its rotational axis. The particular codes employed can take a variety of forms to suit particular operating requirements, and can include optically, magnetically or electrically sensible coding arrangements which are per se well known in the art.

For many purposes it is useful and desirable to know the extent and sense of angular deviation of the rotatable code element with respect to a reference position. For example, in marine navigation it is often useful to provide an indication of the extent and sense to which the course of a vessel is deviating from an intended course to signal that a course correction should be made. Such an indication can be employed, for example, in an automatic pilot system to enable steering of a vessel back to an intended course. Since encoders of conventional construction usually provide an output representation of angular position, additional signal processing must be employed to produce output indications of the extent and sense of angular deviation from a reference position. It is an object of the present invention to provide an encoder in which the angular deviation to either side of an intended position, as well as the angular position of a rotatable code element are both provided by a single code element and the unique processing of digital signals derived therefrom.

SUMMARY OF THE INVENTION

Briefly, the invention comprises a code element adapted for rotation about its axis and having a plurality of codes representing respective angular positions and which are sensible by an associated sensor to provide output signals representative of angular position. The codes provided on the code element are of Gray coded format and are of a particular sequence such that successive code values occur with only single bit transitions between adjacent codes. The digital signals provided by the associated sensor are also of Gray coded format and are processed by logic circuitry providing either of two modes of operation. The operating mode of the logic circuitry is governed by logic control signals which are derived from the most significant bit of the detected Gray code and an input control signal.

In one mode of operation, data detected from the code disk is decoded to provide an indication of the actual angular position of the disk with respect to a predetermined reference position. In a second mode of operation, data detected from the disk is decoded to provide an indication of the deviation of the disk from a reference position and the extent and sense of such deviation.

DESCRIPTION OF THE DRAWINGS

The invention will be more fully understood from the following detailed description taken in conjunction with the accompanying drawings, in which.

DETAILED DESCRIPTION OF THE INVENTION

Figure 1:
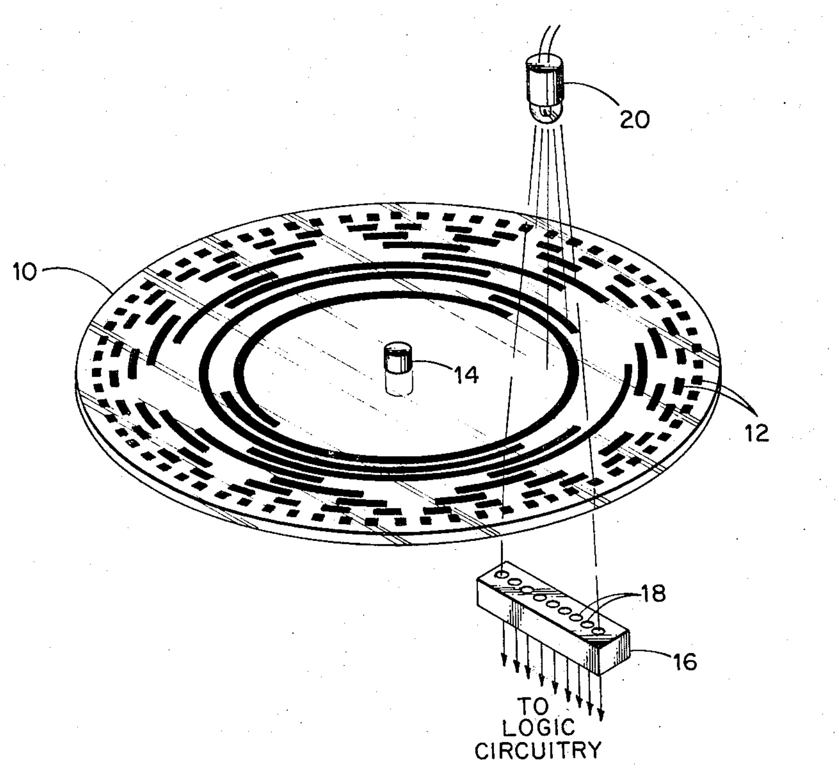
FIG. 1 is a diagramatic representation of an optical encoder according to the invention.
Figure 2:
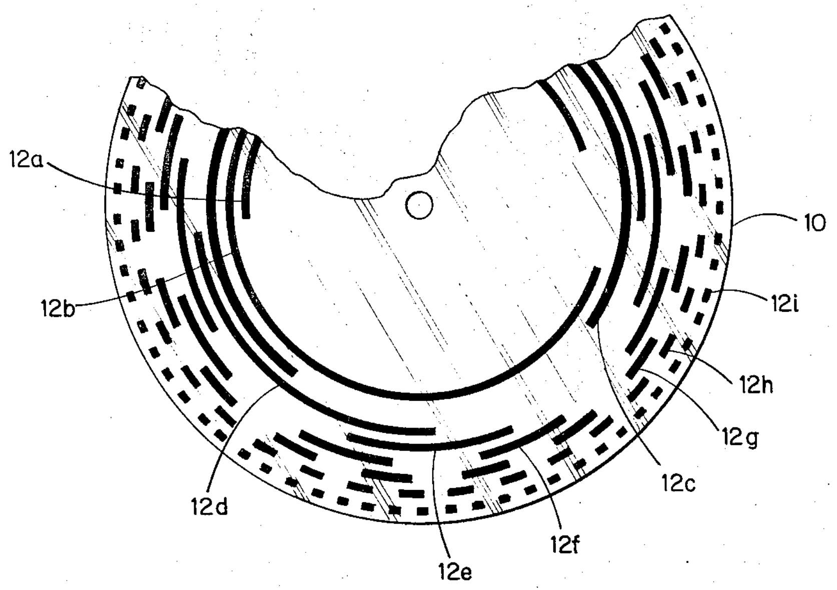
FIG. 2 is a partly cutaway plan view of an encoder disk useful in the invention.

The invention in a preferred embodiment employs a disk of light transmissive material having optically sensible codes thereon in the form of a plurality of alternately light transmissive and opaque segments arranged on respective circumferential tracks of the disk. Referring to FIGS. 1 and 2, there is shown a disk 10 of light transmissive material, such as plastic or glass, having a plurality of concentric tracks 12 thereon, each track having a different predetermined number of alternately light transmissive and opaque equiangular segments. Each track 12 is coded to represent one bit of a multiple bit Gray code. A sequence of code values is employed around the disk such that transitions between each Gray code representation of angular position is accomplished with only a single bit change between each angular position. In the disk illustrated, nine concentric tracks, 12*a* through 12*i* are employed to achieve a resolution of one degree. The innermost track 12*a*, contains one opaque segment which extends around 180° of this track, the other 180° segment being light transmissive, this track forming the most significant bit of the multiple bit code. The tracks 12*b* through 12*i*, formed on respectively larger radii of disk 10, contain successively different numbers of coded segments representing the additional bits of the Gray code.

The disk 10 is supported for relative rotation about its axis 14 with respect to a photosensor array 16 which is disposed along a radius of disk 10, and which includes a plurality of photosensitive cells 18 each of which is in light receiving relationship with a respective concentric track 12. A light source 20, such as a light emitting diode or incandescent lamp, is disposed adjacent the surface of disk 10 opposite to that confronting sensor 16 and is operative to transmit light through the coded tracks 12 for receipt by respective photocells 18. Each photocell 18 provides an output signal of one value in the presence of light received from a confronting track of disk 10, and of a second value in response to the absence of light received from the associated coded track. The photosensor array 16 thus provides a plurality of digital electrical signals representative of the Gray code sensed at a particular angular position of disk 10. These digital signals are processed according to the invention to provide, selectively, an output indication of angular position or of the extent and sense of deviation of the disk from a reference position.

Figures 3, 4, 5, 6:
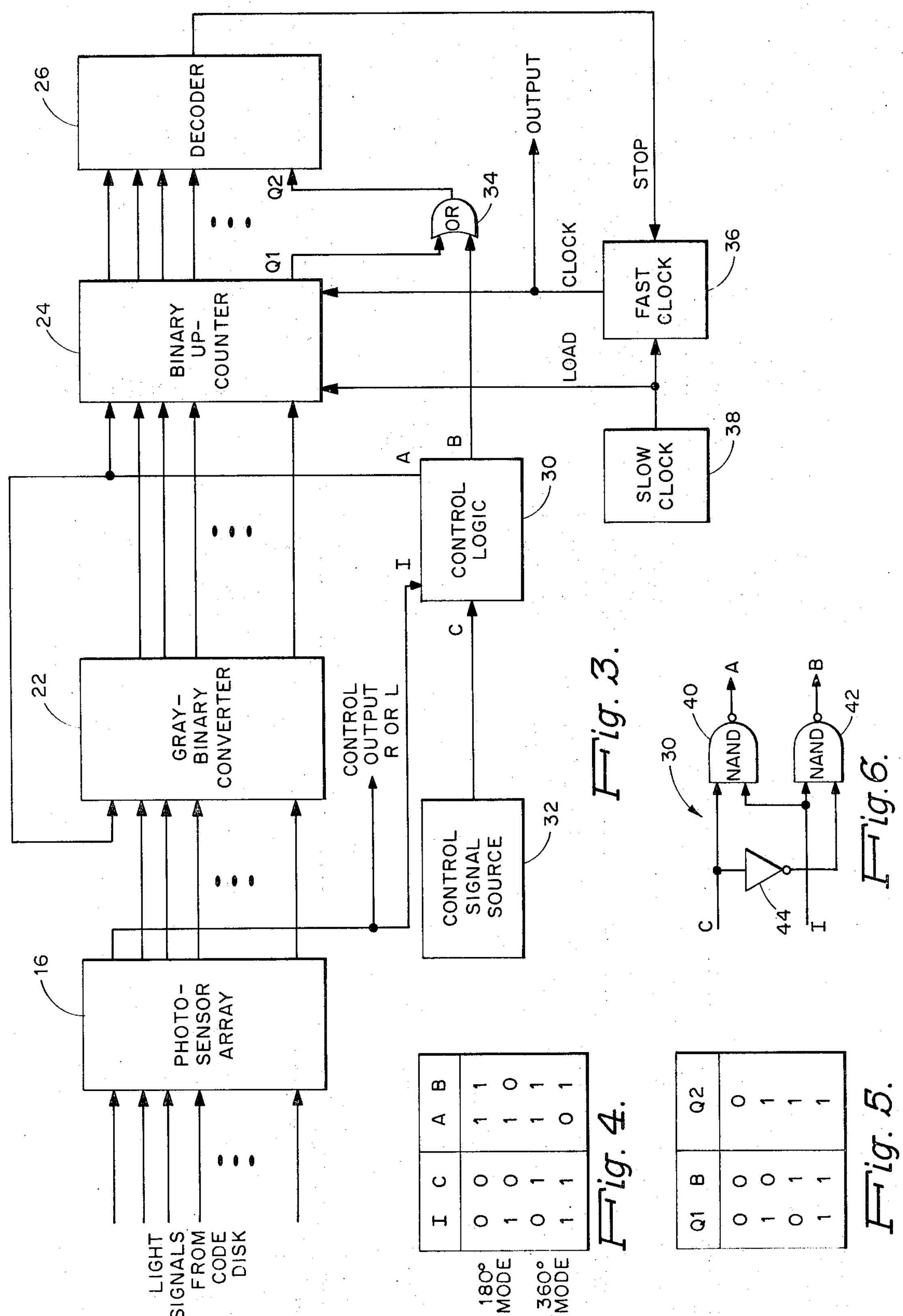
FIG. 3 is a block diagram representation of logic circuitry according to the invention.
FIGS. 4 and 5 are truth tables useful in describing operation of the logic circuitry of FIG. 3.
FIG. 6 is a schematic diagram of the control logic of FIG. 3.

The logic circuitry of the invention is illustrated in FIG. 3. Light signals received from the code disk by photosensor array 16 are transduced into a plurality of digital electrical signals, each of the signals representing a bit of a Gray-coded number, and each, except the most significant bit, being applied to a respective input of a Gray-to-binary converter 22. The output signals of converter 22 are applied to a binary up-counter 24 which, in turn, has its output coupled to a decoder 26. The output of the photosensor array 16 which detects the most significant bit of the Gray code provided on the code disk, which in the illustrated embodiment is the innermost track, is applied as an input signal I to control logic 30. The control logic also receives an input signal C from a control signal source 32, which provides a signal of first or second logic level. The logic 30 provides a first output signal A to the most significant bit input of converter 22 and counter 24, and a second output signal B which is applied to one input of an OR gate 34. The OR gate also receives an input signal Q1 from the least significant bit output of counter 24, and provides an output signal Q2 to the least significant bit input of decoder 26.

The counter 24 is driven by a fast clock 36 which, in turn, is enabled by a slow clock 38. The output of decoder 26 is applied to the fast clock as a stop signal to discontinue the clocking operation thereof. The output of slow clock 38 is also employed as a load signal for enabling counter 24. A pulse train provided by fast clock 36 serves as the system output and which can be applied to utilization means such as a display or automatic control system. An output is also provided by the most significant bit from array 16 to denote the sense of deviation in one mode of operation.

As discussed, a Gray-coded disk is employed of particular sequence to provide only single bit transitions from each Gray-coded number to the next throughout the circumference of the disk. The transition between 0° and 359° is also achieved with only a single bit change in the corresponding codes. Gray code values corresponding to the decimal numbers from 76 to 435 are employed. The Gray code equivalent of decimal 76 represents a 0°position, while the Gray code equivalent of decimal 435 represents a 359° position. The provision of a code having only single bit transitions is advantageous in allowing efficient logic processing and in minimizing the ambiguous sensing of adjacent codes which can arise if the code disk is positioned with the linear photosensor array aligned between adjacent code positions. By virtue of the cyclical code employed, ambiguity is limited to only a single bit, or one degree in the embodiment illustrated.

Upon a load command from clock 30, counter 24 is set to an initial count which is the code from converter 22, and operates to a final count which is the code detected by decoder 26. The decoder provides, upon such detection, a stop signal to fast clock 36 to discontinue clock operation. The decoder 26 is typically a NAND gate operative to provide an output signal in the presence of a binary 1 in each predetermined position of a multiple bit code. The decoder is arranged to detect either of two successive codes in accordance with the value of the control bit Q2, which in the present embodiment is the least significant bit. The binary code detected by decoder 26 in the embodiment under discussion is the binary equivalent of decimal 436 of decimal 437, depending on the binary value of the control signal Q2.

The fast clock 36 provides a number of clock pulses to counter 26 which is equal to the difference between the initial count applied to the counter and the final count, and this train of pulses serves as a system output to indicate the angular extent of motion of disk 10 relative to array 16. The fast clock can be enabled by manual means, or as in the illustrated embodiment by a start signal from a slow clock 38 employed to determine the sampling rate at which the code disk is read and decoded. The slow clock can be free running or manually started to provide an output indication, and effectively provides a time delay between the sensing of the disk and the corresponding output indication of sensed position.

The control logic 30 operates according to the truth table depicted in FIG. 4, where I represents the binary value of the most significant bit read from the disk by array 16, C represents the binary value of the control signal provided by source 32, and A and B represent the binary values of the output signals of the control logic. The control logic 30 is typically implemented as depicted in FIG. 6 by first and second NAND gates 40 and 42 which respectively provide the output signals A and B. The input signal C is applied to one input of gate 40 and is also applied, by way of an inverter 44, to an input of gate 42. The input signal I is applied as a second input to each gate 40 and 42. It will be appreciated that the gating configuration of FIG. 6 is but one implementation of logic circuitry which can provide the required function.

In one mode of operation, designated the 360° mode, an output indication is provided in the form of pulses of a number which represent the angular position of the code disk from 0° to 359° relative to the photosensor array. As can be seen from FIG. 4, in the 360° mode the control signal C is always of binary value 1, while the input signal signal I is of binary value 0 or 1 depending upon which 180° segment of the disk is being read. The output signal A is the complement of the input signal I and is effective to cause inversion of the binary code provided by converter 22 and applied to counter 24. The control signal B is always of binary value 1 in this operating mode.

The OR gate 34 operates according to the truth table of FIG. 5 to provide an output signal Q2 which is of binary value 1 in this 360° mode. The signal Q2 applied to decoder 26 serves as a control signal therefor to govern which of two input codes is detectable by the decoder. In this 360° mode, decoder 26 is operative to decode the binary equivalent of decimal 436, and upon such detection to provide a stop signal to fast clock 36.

As an example, the operation of the logic circuitry will be described for processing a Gray code representing an angular disk position of 90°. The Gray code sensed from the disk is 011110101. The most significant bit of this code, which is binary 0, is applied as input signal I to control logic 30. The remaining bits of the code are applied to respective inputs of converter 22. Corresponding outputs of converter 22 are applied to respective inputs of counter 24. The output signal A is applied to the most significant bit position of converter 22 and counter 24. Since the binary value of the most significant bit applied to converter 22, which is binary 1, is the inverse of the most significant bit of the Gray code sensed by array 16, the converter 22 is caused to invert the output binary code. The binary code provided by converter 22 is the complement of the equivalent binary number represented by the Gray coded signal read from the code disk. The converter itself is well known in the electronics art, a typical implementation being described in Electronic Analog to Digital Conversion, H. Schmid, Van Nostrand, Reinhold Co. (1970), pages 312–313, and it will be appreciated that by the nature of such converters, the inversion of the most significant bit of the code applied as an input thereto will cause inversion of the entire output code.

The binary code applied to counter 24 is thus the complement of the binary equivalent of the Gray code sensed from the disk, and in the example given is 101011001. This binary number is the equivalent of decimal 345, and counter 24 is operative under the control of fast clock 36 to count from the binary version of decimal 345 to the binary version of decimal 436, at which time decoder 26 provides a stop signal to clock 36. A train of 91 pulses are provided during the counting interval by fast clock 36 as an output to represent the 90° angular position of the code disk, and which can be applied to any suitable utilization apparatus, such as a numerical display or an automatic control system for maintaining a particular angular position.

It will be noted that an output pulse train is provided having one more pulse than the angular position represented. The extra pulse is employed as a reset pulse for the utilization apparatus receiving the output pulse train. The number of output pulses representing angular position in a particular embodiment is a matter of choice. If such reset pulse is not needed by particular utilization apparatus, the decoding count of decoder 26 can be selected to yield for example a number of output pulses equal to angular position, or some other number of output pulses suitable for the specific implementation employed. The control output from array 16 is not usually employed during the 360° operating mode, although the output will be indicative of the particular semicircular segment of the disk being read.

The second mode of operation is designated the 180° mode in which the invention is operative to provide an output indication of the angular deviation of the code disk from the 0° position, and the sense of such deviation. Two output indications are provided; one being of a binary value to denote the sense of deviation to the right or left of 0°, the other being in the form of pulses of a number representing clockwise deviations from 0° to 179°, and counter-clockwise deviations from 1° to 180°. Referring again to FIG. 4, in the 180° mode, control signal C is always of binary value 0°, while input signal I is either of binary value 0 or 1 in accordance with the right or left circular segment of the disk being sensed. The output signal A is of binary value 1, while the ouput signal B applied to OR gate 34 is of either binary value 0 or 1 depending upon the value of input signal I. The signal Q2 provided by OR gate 34 to decoder 26 is operative to provide detection of a binary code which is the binary equivalent of decimal 436 or 437 depending on which 180° segment of the code disk is being sensed.

In reading the right-hand semicircular segment of disk 10, that is, angular positions from 0° to 179° to the right of the 0° reference position, B is binary 1 and Q2 is binary 1. Decoder is operative to detect the binary codes equal to decimal 436. Assume, as an example, an angular deviation of 90° to the right of the 0° reference position. The Gray code sensed from disk 10 is 011110101. The most significant bit, binary 0, is the complement of the corresponding bit provided by output signal A to converter 22, and the converter is thus caused to invert the output code thereof. This output code, which as discussed is the complement of the binary equivalent of the detected Gray code, is 101011001 or decimal 345. The decoder 26 detects the binary version of decimal 436 since control signal B is binary 1. Counter 24 thus increments 91 times and the 91 pulses provided by fast clock 36 represent the 90° deviation. The control output is binary 0, denoting a right-hand sense.

In reading the left-hand semicircular segment of the disk, which includes angular positions from 1° to 180° to the left of the 0° reference position, B is binary 0, while Q2 equals Q1. Q1 alternates between binary 0 and binary 1 for each succeeding count. For a binary count equal to decimal 436, Q1 and Q2 equal binary 0 and decoder 26 will not sense this code. When the binary count is equal to decimal 437, Q1 and Q2 are binary 1, permitting the detection of this code by decoder 26. A train of output pulses is provided by fast clock 36 which is of a number one more than detected when decoder 26 detects the binary equivalent of decimal 436. This additional output pulse is provided when reading the left-hand disk segment to provide a correct output indication of angular deviation, which would otherwise be in error by 1°.

To aid in explaining operation of the logic circuitry, consider the example of providing an output indication of an angular deviation 90° to the left of the 0° reference position. The Gray code for this position, which is 270° on the code disk, is 1111110111. The output signal A is of binary value 1 in this instance, and, being the same as the most significant bit of the detected Gray code, no inversion is provided by converter 22. The converter provides an output signal which is the binary equivalent of the input Gray code, and is 101011010, the binary equivalent of decimal 346. Since in this instance the decoder detects a binary version of decimal 437, 91 clock pulses are provided by fast clock 36 during the incrementing of counter 24. An output indication of 90° is thereby provided to denote the deviation of the disk from the reference position. The sense of deviation, left in this instance, is denoted by the binary value 1 provided by the most significant bit output of array 16.

It will be appreciated that the invention is not limited to the particular implementations shown and described. For example, the code element can be of forms other than a disk, such as a cylinder rotatable about its longitudinal axis and having code markings arranged around a surface thereof for sensing and subsequent processing. Moreover, an optical code of light reflective and opaque segments can also be employed in place of the transmissive segments depicted. In such a reflective code element, as is known in the angle encoder art, both the light source and photosensor are disposed on the same side of the code element, with light usually being angularly directed onto the code surface for reflection onto an angularly arranged sensor. Other than optical codes can also be employed in the invention; the codes being, for example, electrically or magnetically sensible. Accordingly, it is not intended to limit the invention by what has been particularly shown and described except as indicated in the appended claims.

What is claimed is:

1. An angle encoder operative in response to a control to provide alternative output indications of relative angular position or angular deviation, said encoder system comprising:

a code element having a sensible code thereon defining a plurality of predetermined multiple bit Gray coded values representative of angular position;

said code having a predetermined angular reference position;

means for sensing the code on said code element and for providing a plurality of digital signals representing a Gray coded version of angular position;

said code element and said sensing means being adapted for relative rotation about an axis of said element;

logic circuitry operative in response to said plurality of digital signals and including:

Gray-to-binary code converter means for converting said Gray coded digital signals into binary coded output signals;

said converter means being responsive to said plurality of digital signals except the most significant bit thereof;

a unidirectional binary counter receiving in the bit locations thereof below the most significant bit location said binary coded output signals from said converter means;

decoder means coupled to the output of said counter means and operative to provide an output signal in response to the counter output reaching a selectable first or second predetermined count;

clock means for providing clock pulses to increment said counter from the binary number received from said converter to the first or second predetermined count at which said decoder is responsive to provide the decoder output signal;

said decoder output signal being applied to stop the provision of the clock pulses by said clock means;

a control signal source for providing a first control signal of first or second binary value to represent selection of relative angular position or angular deviation output indications;

control logic operative in response to said first control signal and to the digital signal representing the most significant bit of said Gray code to provide second and third control signals;

said second control signal being an inversion of said digital signal representing the most significant bit when said first control signal is of a first binary value and otherwise having a predetermined binary value;

said second control signal being applied to the most significant bit inputs of said converter means and of said counter;

said third control signal being the inverse of said digital signal representing the most significant bit when said first control signal is of a second binary value and otherwise being of a predetermined binary value; and OR gating means operative in response to said third control signal and the least significant bit signal from said counter to provide a fourth control signal to said decoder means to select the first or second counts thereof;

said fourth control signal being the logical OR of the third control signal with the least significant bit from said counter;

the clock pulses provided by said clock means being, in response to said first control signal of first binary value, of a number representative of the relative angular position of said code element with respect to said predetermined angular reference position, and being, in response to said first control signal of second binary value, of a number representative of the angular deviation of said code element with respect to the predetemined angular reference position, the digital signal representing the most significant bit indicating the sense of said angular deviation.

2. An angle encoder according to claim 1 wherein said Gray coded values on said code element are of a predetermined sequence corresponding to decimal numbers from 76 to 435, the Gray coded equivalent of decimal 76 representing an angular position of 0°, the Gray coded equivalent of decimal 435 representing an angular position of 359°, each adjacent pair of Gray coded values differing by only a single bit.

3. An angle encoder according to claim 2 wherein said clock means includes:

a fast clock operative at a predetermined rate for providing said clock pulses; and a slow clock operative in a predetermined lower rate than the rate of said fast clock and operative to control the sampling rate at which said digital signals are processed.

4. An angle encoder according to claim 1 wherein the most significant bit output of said sensing means provides an output indication of the sense of angular deviation of said code element from said predetermined angular reference position.

* * * * *